United States Patent
Shirazinia et al.

(10) Patent No.: US 11,664,824 B2
(45) Date of Patent: May 30, 2023

(54) SYSTEMS AND METHODS FOR FAST LAYERED DECODING FOR LOW-DENSITY PARITY-CHECK (LDPC) CODES

(71) Applicant: Telefonaktiebolaget LM Ericsson (publ), Stockholm (SE)

(72) Inventors: Amirpasha Shirazinia, Solna (SE); Mattias Andersson, Sundbyberg (SE); Magnus Malmberg, Lund (SE); Sara Sandberg, Luleå (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 697 days.

(21) Appl. No.: 16/476,599

(22) PCT Filed: Jan. 9, 2018

(86) PCT No.: PCT/EP2018/050476
§ 371 (c)(1),
(2) Date: Jul. 9, 2019

(87) PCT Pub. No.: WO2018/127607
PCT Pub. Date: Jul. 12, 2018

(65) Prior Publication Data
US 2019/0372593 A1 Dec. 5, 2019

Related U.S. Application Data

(60) Provisional application No. 62/444,137, filed on Jan. 9, 2017.

(51) Int. Cl.
*H03M 13/11* (2006.01)
*H03M 13/00* (2006.01)
*H03M 13/33* (2006.01)

(52) U.S. Cl.
CPC ...... *H03M 13/1137* (2013.01); *H03M 13/114* (2013.01); *H03M 13/116* (2013.01); *H03M 13/616* (2013.01)

(58) Field of Classification Search
None
See application file for complete search history.

(56) References Cited

U.S. PATENT DOCUMENTS 8,990,661 B1 * 3/2015 Micheloni ............ H03M 13/114
714/758
2005/0138519 A1 6/2005 Boutillon et al.
(Continued)

FOREIGN PATENT DOCUMENTS

WO 2009 053940 A2 4/2009

OTHER PUBLICATIONS

Wu et al., Updating conflict solution for pipelined layered LDPC decoder, IEEE, Conference Paper, pp. 1-6. (Year: 2015).*
(Continued)

*Primary Examiner* — Cynthia Britt
*Assistant Examiner* — Dipakkumar B Gandhi
(74) *Attorney, Agent, or Firm* — Baker Botts L.L.P.

(57) ABSTRACT

According to certain embodiments, a method is provided for fast layered decoding for Low-density Parity-Check (LDPC) codes with a Parity-Check Matrix (PCM) that includes at least a first layer and a second layer. The method includes reading, from a memory, Variable Node (VN) soft information, wherein the VN soft information is associated with a message from a VN to a Check Node (CN) of the second layer of the PCM. A new CN to VN message is calculated from the CN of the second layer of the PCM. New VN soft information is calculated for the VN. The new VN soft information is calculated based on the VN soft information and a new CN to VN message from a CN of the first layer to the VN and an old CN to VN message from the CN of the first layer to the VN such that the updating of new VN soft (Continued)

information is delayed by at least one layer. The fast layered decoding has lower decoding latency and utilizes the decoding hardware more efficiently than standard layered decoding techniques. This may be achieved by keeping the memory access and processing hardware units active simultaneously to avoid excess decoding latency. More specifically, certain embodiments may carry out memory access and computation process simultaneously, without any effort to make the row layers mutually orthogonal to each other. Another technical advantage may be that the proposed decoding algorithm adjusts the LLRs to partially account for deviations from the layered decoding due to non-orthogonal rows.

18 Claims, 11 Drawing Sheets

(56) References Cited

U.S. PATENT DOCUMENTS

| | | | | |
|---|---|---|---|---|
| 2010/0077275 | A1* | 3/2010 | Yu | H03M 13/116 |
| | | | | 714/752 |
| 2010/0174965 | A1 | 7/2010 | Sutskover et al. | |
| 2010/0269020 | A1* | 10/2010 | Heinrich | H03M 13/1137 |
| | | | | 714/763 |
| 2011/0010602 | A1* | 1/2011 | Chung | H03M 13/1134 |
| | | | | 714/752 |
| 2016/0277036 | A1* | 9/2016 | Wang | H03M 13/6325 |

OTHER PUBLICATIONS

A Reduced Complexity Decoder Architecture via Layered Decoding of LDPC Codes by Dale E. Hoceva—IEEE 2004.

Configurable, High Throughput, Irregular LDPC Decoder Architecture: Tradeoff Analysis and Implementation by Marjan Karkooti et al.; Application-specific Systems, Architectures and Processors—IEEE 2006.

PCT Notification of Transmittal of the International Search Report and teh Written Opinion of the International Searching Authority, or the Declaration for International application No. PCT/EP2018/050476—dated Mar. 9, 2018.

3GPP TSG RAN WG1 Meeting #87; Reno, USA; Source: Ericsson; Title: Design of LDPC Codes for NR (R1-1611321)—Nov. 14-18, 2016.

* cited by examiner

FIGURE 2

SYSTEMS AND METHODS FOR FAST LAYERED DECODING FOR LOW-DENSITY PARITY-CHECK (LDPC) CODES

PRIORITY

This nonprovisional application is a U.S. National Stage Filing under 35 U.S.C. § 371 of International Patent Application Ser. No. PCT/EP2018/050476 filed Jan. 9, 2018 and entitled "Systems and Methods for Fast Layered Decoding for Low-Density Parity-Check Codes (LDPC) Codes" which claims priority to U.S. Provisional Patent Application No. 67/444137 filed Jan. 9, 2017 both of which are hereby incorporated by reference in their entirety.

TECHNICAL FIELD

The present disclosure relates, in general, to communications and, more particularly, systems and methods for fast layered decoding for Low-density parity-check (LDPC) codes.

BACKGROUND

Low-density parity-check (LDPC) codes are easily described through a parity-check matrix (PCM), where the rows and columns correspond to check nodes (CNs) and variable nodes (VNs), respectively. FIG. 1 illustrates a PCM and the corresponding bipartite graph. As depicted, each edge in the PCM corresponds to an edge between a CN and a VN.

The PCM can be mapped to a bipartite graph composed of CNs and VNs, where the rows and columns of the PCM correspond to check nodes and variable nodes, respectively. Each non-zero entry in the PCM corresponds to an edge between a check node and a variable node. Each VN corresponds to a coded bit in a codeword of the LDPC code. The description in the following focuses on binary LDPC codes, where the entries of the PCM are either 1 or 0, but can easily be changed to account for non-binary LDPC codes as well.

An important class of LDPC codes are quasi-cyclic (QC) LDPC codes. The PCM H of a QC-LDPC code is of size M×N, and can be represented by a base matrix H_base of size $m_b=M/Z$ and $n_b=N/Z$, and a lifting factor Z. Each entry of H_base contains either the number −1 or one or more numbers between 0 and Z−1. For example, let i and j be integers between 0 and (m/Z−1), and 0 and (n/Z−1), respectively, then the submatrix formed from the entries in rows $Z*i$ to $Z*(i+1)-1$ and columns $Z*j$ to $Z*(j+1)-1$ are determined by the entry in row i and column j of H_base in the following way:

If H_base(i,j)=−1, then the submatrix in the expanded binary matrix H is equal to the Z by Z zero matrix.

If H_base(i,j) contains one or more integers $k_1, k_2, \ldots k_d$ between 0 and Z−1, the submatrix in the expanded binary matrix H is equal to the sum of the shifted identity matrices $P\_k_1+P\_k_2+ \ldots +P\_k_d$, where each Z×Z submatrix P_k is obtained from the Z by Z identity matrix by cyclically shifting the columns to the right k times.

The above structure makes the LDPC encoding and decoding implementations simpler by partitioning the PCM into different blocks, as Z rows can be processed in parallel which reduces encoding/decoding latency as well. We note that the processing of a layer comprised of Z rows is less complex since it can be implemented with shift registers.

FIG. 2 illustrates a practical example of one of the base matrices H_base of the quasi-cyclic LDPC codes in IEEE 802.16e. This example is for R=½, Z=96 and information block length k=1152. Note that each block in the PCM is of dimension 96×96, and each layer is of dimension 96×2304.

Typically, for decoding of LDPC codes, belief propagation (BP) is recognized as a successful decoding algorithm. It is an iterative message-passing algorithm such that at each iteration variable and check nodes exchange messages. In the end of each iteration, an estimate of each VN is computed. The exchanged messages as well as the estimate of the VNs are usually denoted as soft information, and represent a belief of the value of a VN, as well as how strong this belief is. The soft information can for example be a log-likelihood ratio (LLR), a likelihood ratio (LR), or scaled or quantized versions of these. In some cases, the soft information is saturated to a maximum value. A message passing decoder operates by exchanging messages between neighboring VNs and CNs. The order in which these messages are calculated and exchanged is described by the schedule of the decoder. Two important schedules are the flooding schedule, and the row-layered schedule. The flooding schedule is briefly described first. The input to the algorithm is the set of soft information of the VNs. These can for example be obtained by receiving a transmission from a transmitter and demodulating the transmission. In the first iteration, the decoder calculates a message from each VN to its neighboring CNs. The message is calculated from the channel observation of the VN. Then each CN uses the incoming messages from its neighbors to calculate messages to each of its neighboring VNs. In the second iteration each VN calculates messages to its neighboring CNs based on the channel observation as well as the incoming messages from its neighbors. Then each CN uses the incoming messages from its neighbors to calculate messages to each of its neighboring VNs. This is repeated up to a maximum number of iterations. After each iteration, the decoder can calculate soft estimates of each variable node. These soft estimates can be used to generate hard estimates, and if these hard estimates correspond to a valid codeword, as can be checked through the parity check equations, the decoding can stop early.

The rules used to calculate the messages between nodes are called the message update rules. Different versions of message passing decoders uses different message update rules. Some important examples include the sum-product rule, the min-sum rule, normalized min-sum, off-set min-sum. Also note that the message update rules can differ between different iterations and between different VNs and CNs. In practice, the soft messages of each variable node, as well as the messages exchanged between nodes are quantized to a, possibly different, finite number of bits in the decoder. This leads to slightly different message update rules, taking into account the quantization and/or saturation of the messages or soft variable node estimates.

In general, the schedule of the order can be independent of the message update rules.

In row-layered scheduling, the order in which the messages are calculated and exchanged is different from the flooding schedule. The rows of the PCM are partitioned into blocks with the property that every column contains at most one non-zero entry in each block. For simplicity, we describe the version of the schedule as applied to QC LDPC codes where each entry in the base matrix H_base is either −1, or a single integer between 0 and Z−1. In this case the PCM can be partitioned into blocks of Z rows, each satisfying the property that every column contains at most one non-zero entry in each block. Note that the partitioning of the rows of PCM corresponds to a partitioning of the CNs in the bipartite graph. In each iteration, the decoder calculates the VN to CN messages for all CNs in the first block. Then the CN to VN messages from these CNs are calculated, and the soft estimates of each VN are updated based on the earlier estimate and the new CN to VN messages from the first block. This process is then repeated for each block of the PCM/bipartite graph. In the same way as for the flooding schedule, the decoding can stop early if the hard variable node estimates correspond to a valid codeword. These blocks may be referred to as layers herein. In general, layered scheduling provides the same performance as that of the flooding scheduling but within half as many iterations. Therefore, the layered decoding converges faster and its latency and decoding complexity becomes lower.

The layered decoding process may use the following defined notations:

m: check node (CN) index ($1 \leq m \leq M$)
j: variable node (VN) index ($1 \leq j \leq N$)
N(m): Set of VNs that are connected to CN m
b: an index of a layer within the M×N PCM such that each column in the submatrix has at most a weight one ($1 \leq b \leq M/Z$)
$L(q_{mj})$: message from VN j to CN m
$L(q_j)$: LLR value of VN j
$R_{mj}$: message from CN m to VN j
Max_iter: maximum number of decoding iterations As used herein the term "connected to" refers to a mathematical association. Thus, in the above layered decoding process the set of NBs are mathematically connected to CN m and, thus, may be said to be associated with CN m. The layered decoding algorithm from (Hocevar, 2004) may be summarized as follows:

| | |
|---|---|
| (1): | for iteration i = 1 to Max_iter |
| (2): | for layer b = 1 to M/Z |
| (3): | for row r= 1 to Z |
| (4) | m = (b−1)*Z + r |
| (5): | $L(q_{mj}) = L(q_j) - R_{mj}$ , j ∈ N(m) |
| (6): | $R_{mj} = f(L(q_{mn}))$ , n ∈ N(m), n ≠ j |
| (7): | $L(q_j) = L(q_{mj}) + R_{mj}$ |
| (8): | end for row |
| (9): | end for layer |
| (10): | end for iteration |

According to this previous technique for implementing layered decoding, the following factors may be considered 1. $L(q_j)$, for all VNs, may be initialized by channel LLRs, i.e., $L(q_j)=2r_j/\sigma^2$, where $r_j$ is the received codeword from the channel and $\sigma^2$ is the channel noise variance.
2. $R_{mj}$ may be initialized as zero.
3. In step (6) of the algorithm summarized above, the function ƒ(•) is the check-node message update rule, and may for example be chosen from any of the sum-product, normalized min-sum, average min-sum algorithms or any variants of these. Note that as described herein, f(L(q_mn)) is provided as a shorthand for a multivariable function that takes as input all messages {L(q_mn)} for n that belong to N(m). For example, if the sum-product algorithm is used, the update equation in step (6) may be as follows:

$$R_{mj} = f(L(q_{mn})) = \prod_{n \in N(m), n \neq j} \text{Sign}(L(q_{mn})) \sum_{j \in N(m), n \neq j} \varphi(L(q_{mn})),$$

$j, n \in N(m), n \neq j$ $$\varphi(x) = \frac{\log(e^x + 1)}{e^x - 1}.$$

In some cases the function ƒ(•) differs between each iteration, or is different for different CNs.

4. Where the layers of Z rows are orthogonal, the steps (3)-(8) can be parallelized. Furthermore, if the LDPC code has quasi-cyclic structure, the implementation of these steps can utilize shift registers to achieve very efficient decoding.

FIG. 3 illustrates the interworking between the memory access unit and the processing unit for layered decoding using the technique for layered decoding described above. As can be seen in FIG. 3 and determined from the summarization of the steps described above, memory access (in step 5) and processing (in step 6) are done in a sequential manner so that memory access becomes idle as processing/computation unit is active, and vice versa. This increases decoding latency, as the latency due to memory access (read and write) is of the same order of processing delay. If the row layers are mutually orthogonal, memory access of one layer can be done in parallel with the processing of another orthogonal layer. However, enforcing a structure on the row layers typically results in a PCM with worse performance in terms of block-error rate.

SUMMARY

To address the foregoing problems with existing solutions, disclosed is systems and methods for fast layered decoding for low-density parity-check (LDPC) codes.

According to certain embodiments, a method is provided in a receiver for fast layered decoding for LDPC codes with a Parity-Check Matrix (PCM) that includes at least a first layer and a second layer. The method includes reading, from a memory, Variable Node (VN) soft information, wherein the VN soft information is associated with a message from a VN to a Check Node (CN) of the second layer of the PCM. A new CN to VN message is calculated from the CN of the second layer of the PCM. New VN soft information is calculated for the VN. The new VN soft information is calculated based on the VN soft information and a new CN to VN message from a CN of the first layer to the VN and an old CN to VN message from the CN of the first layer to the VN such that the updating of new VN soft information is delayed by at least one layer.

According to certain embodiments, a system for fast layered decoding for LDPC codes with a PCM that includes a first layer and a second layer is provided. The system may include a memory storing instructions and processing circuitry operable to execute the instructions to cause the processing circuitry to read, from a memory, Variable Node (VN) soft information, wherein the VN soft information is associated with a message from a VN to a Check Node (CN) of the second layer of the PCM. A new CN to VN message is calculated from the CN of the second layer of the PCM. New VN soft information is calculated for the VN. The new VN soft information is calculated based on the VN soft information and a new CN to VN message from a CN of the first layer to the Vn and an old CN to VN message from the CN of the first layer to the VN such that the updating of new VN soft information is delayed by at least one layer.

Certain embodiments of the present disclosure may provide one or more technical advantages. For example, certain embodiments may provide a sub-optimal decoding method, called fast layered decoding, which has lower decoding latency and utilizes the decoding hardware more efficiently than previous layered decoding techniques. This may be done by keeping the memory access and processing hardware units active simultaneously to avoid excess decoding latency. More specifically, certain embodiments may carry out memory access and computation process simultaneously, without any effort to make the row layers mutually orthogonal to each other. Another technical advantage may be that the proposed decoding algorithm adjusts the LLRs to partially account for deviations from the layered decoding due to non-orthogonal rows. Since the fast layered decoding algorithm works with estimates of the LLRs calculated in layered decoding, the performance in terms of achieved block-error rate may be slightly worse.

Still another technical advantage may be that by applying the fast layered decoding, the decoding is carried out faster, hence, the decoding latency will be reduced by almost half. In certain embodiments, the decoding hardware may also be utilized more efficiently, which may increase the area efficiency of the decoder with up to a factor of two.

Other advantages may be readily apparent to one having skill in the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which:

FIG. 2 illustrates a practical example of base matrix H_base of the quasi-cyclic low-density parity-check (LDPC) codes in IEEE 802.16e;

DETAILED DESCRIPTION

Particular embodiments of the present disclosure may provide solutions enabling fast-layered decoding for low-density parity-check (LDPC) codes. Particular embodiments are described in FIGS. 4-11 of the drawings, like numerals being used for like and corresponding parts of the various drawings.

According to certain embodiments, a fast-layered decoding method is provided that carries out memory access and computation processes simultaneously without requiring row layers to be mutually orthogonal to each other. According to certain embodiments, new notations are provided as follows:

$R_{mj}^{new}$: new message from Check Node (CN) m in layer b connected to Variable Node (VN) j $R_{mj}^{old}$: old message from CN m in layer b connected to VN j According to certain embodiments, the proposed fast layered decoding method may be performed as follows:

```
1:   for iteration i=1: Max_iter
2:       for layer b = 1:M/Z
3:           for row r = 1:Z
4:               m = (b − 1) × Z + r
5:               L(q_mj) − L(q_j) − R_mj^old , j ∈ N(m) , m in layer b
6:               R_mj^new = f(L(q_mn)) , n ∈ N(m), n ≠ j
7:           end for row
8:           for row r' = 1:Z
9:               if b is equal to 1
10:                  m' = M − Z + r'
11:              else
12:                  m' = (b − 2) × Z + r'
13:              end if
14:              L(q_j) = L(q_j) + R_m'j^new − R_m'j^old , j ∈ N(m')
15:              R_m'j^old = R_m'j^new
16:          end for row
17:      end for layer
18:  end for iteration
```

In certain embodiments, the following considerations may hold true:

1. L(q_j) can be initialized by channel Log-Likelihood-Ratios (LLRs), e.g., $L(q_j)=2r_j/\sigma^2$ in the case of Binary Phase Shift Keying (BPSK) modulation, and $R_{mj}^{old}$ can be initialized as zero.

2. In step (14), all LLR updates are related to m' belonging to layer b-1, or layer M/Z in the case that b is equal to 1.

3. In step (6) of the algorithm, like the layered decoding, the function ƒ(•) can be chosen from sum-product, min-sum or any of their variants.

4. The compensation term $R_{mj}^{new}-R_{mj}^{old}$ in step (14) must be considered as we delayed the update of the LLR messages L(q_j). The compensation term enables the fast layered decoding since data dependency between two rows is removed.

5. It should be noted that the fast layered algorithm only calculates an estimate of the LLRs of the standard layered algorithm. Therefore, the Block Error Rate (BLER) performance is expected to be slightly reduced.

Figure 1:
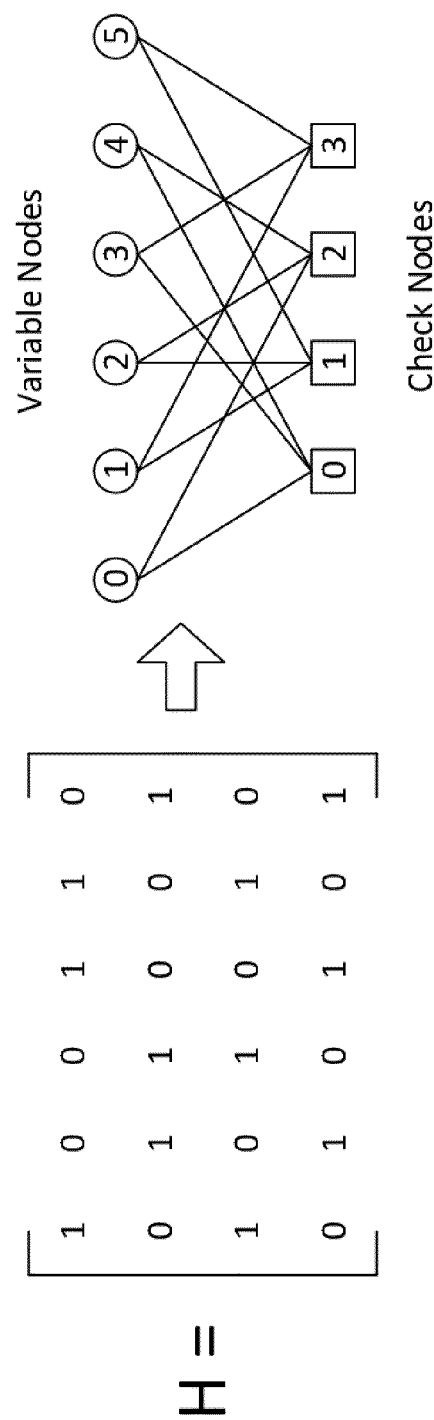
FIG. 1 illustrates a PCM and the corresponding bipartite graph.
Figure 3:
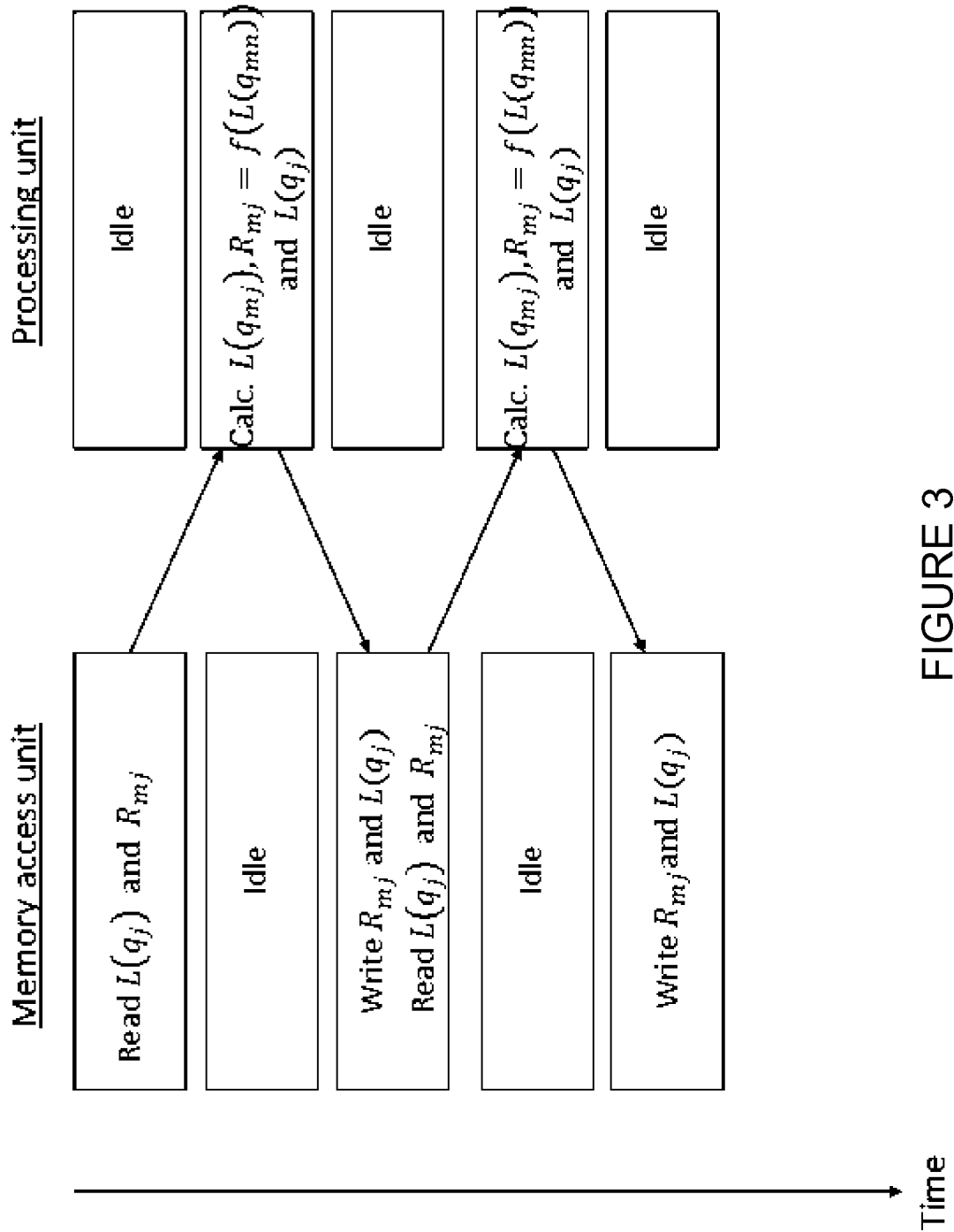
FIG. 3 illustrates the interworking between the memory access unit and the processing unit for layered decoding using the technique for layered decoding.
Figure 4:
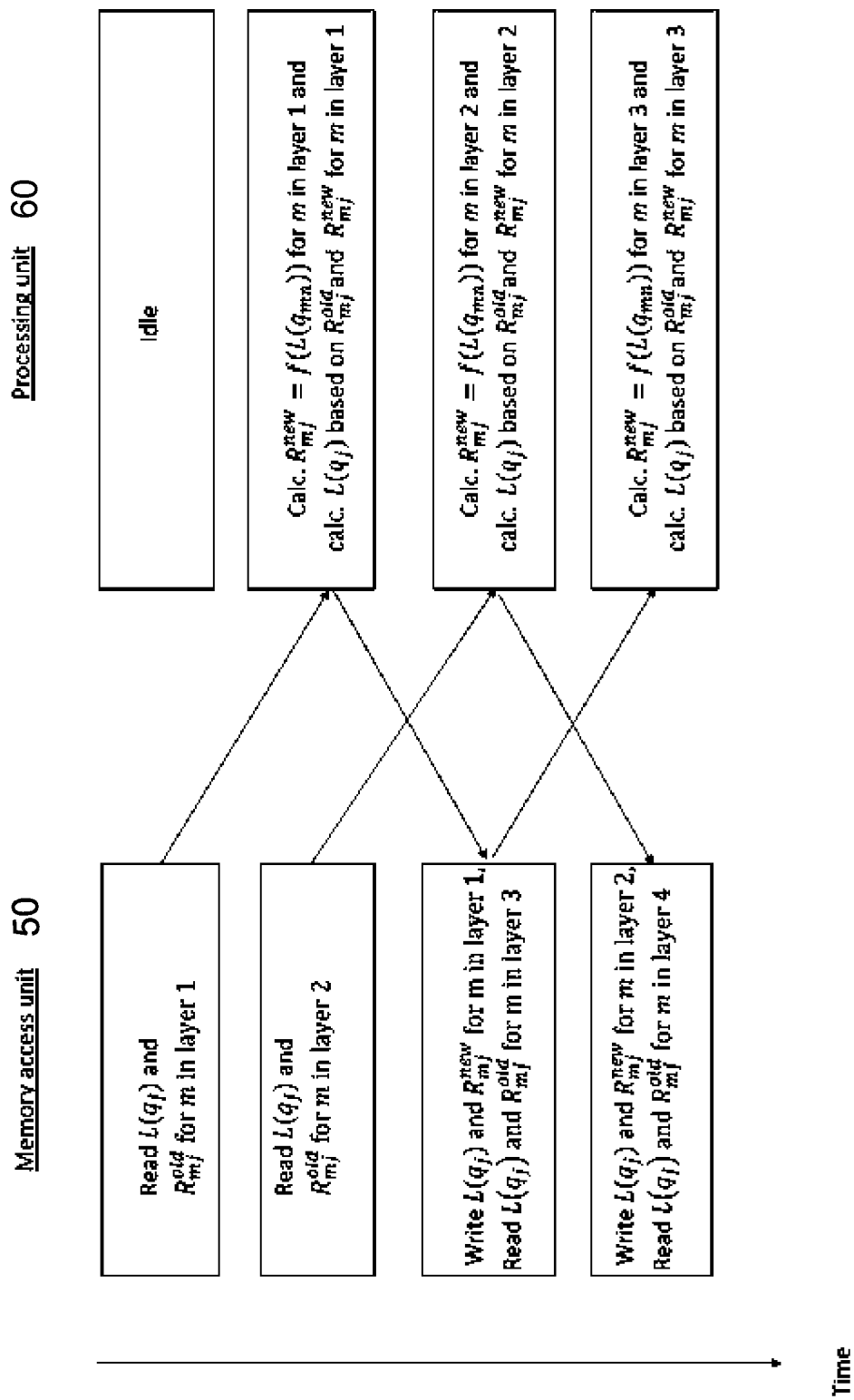
FIG. 4 illustrates the interworking between memory access using and the processing unit for fast layered decoding using the fast-layered decoding algorithm, according to certain embodiments.

FIG. 4 illustrates the interworking between the memory access unit 50 and the processing unit 60, according to certain embodiments. According to previous techniques for layered decoding, the memory access and processing hardware units were active sequential such that memory access became idle when the processing unit became active and vice versa. As depicted in FIG. 4 and corresponding steps (5) and (14) described above, however, the fast layered decoding method allows both memory access unit 50 and processing hardware unit 60 to be active simultaneously. Stated differently, to point out main differences between the fast layered decoding method and previous decoding methods, it is noted that in steps (5) and (6), memory access unit 50 and processing hardware unit 60 are both active simultaneously. Further, as we study step (14), CN messages and LLR values of the previous layers are being read from memory while the current layer is being processed in step (6). Based on these new features, and by keeping both the memory access and computation process active simultaneously, the algorithm reduces decoding latency as discussed below:

For layered decoding, decoding latency is calculated as follows:

(Latency to read active nodes for one row both CN and VN value+latency to calculate VN value for each active position+CN calculation time+ latency to write the active nodes for both the CN and VN value)*number of layers*number of iterations For fast layered decoding, decoding latency is calculated as follows:

(Max(latency to read+latency to write the CN and VN values, latency to calculate the VN value for each active position+CN calculation time)) *number of layers*number of iterations Therefore, the latency for the fast layered decoding is almost half of that of previous methods for layered decoding.

Figure 5:
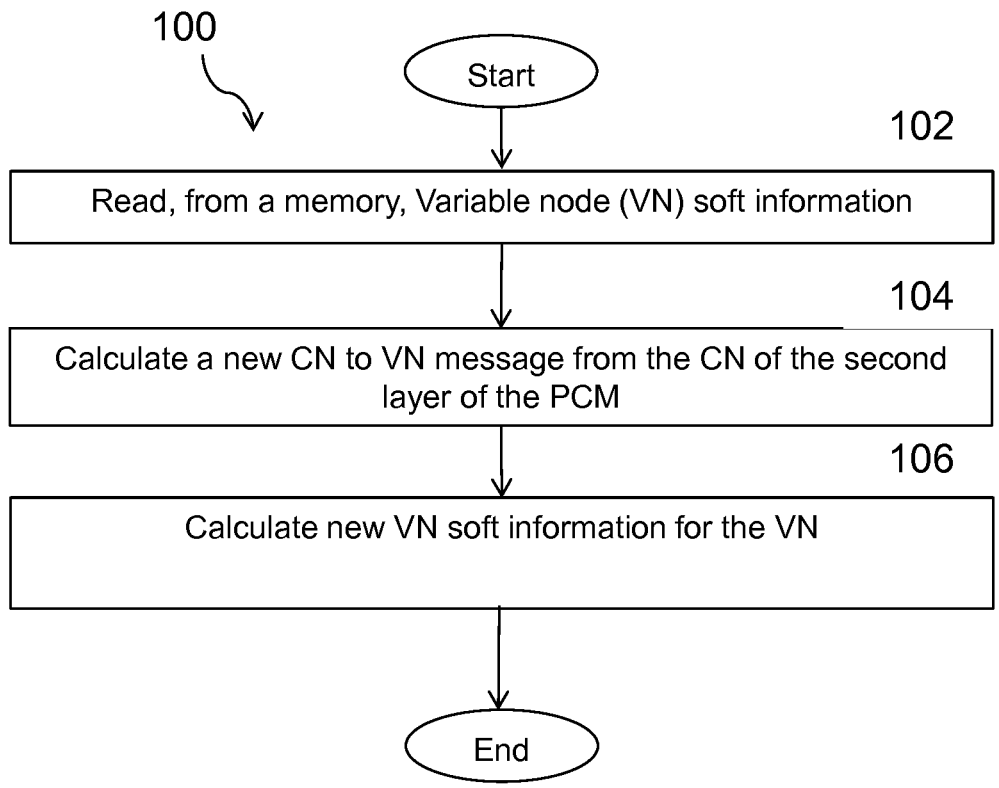
FIG. 5 illustrates an example method for fast layered decoding for LDPC codes, in accordance with certain embodiments.

FIG. 5 illustrates an example method 100 by a receiver for fast layered decoding for LDPC codes with Parity Code Matrix (PCM) that includes at least a first layer and a second layer, according to certain embodiments. The method begins at step 102 when processing circuitry reads, from a memory, VN soft information. According to certain embodiments, the VN soft information is associated with a message from a VN to a CN of the second layer of the PCM. In various embodiments, the VN soft information may include, for example, an LLR value, a likelihood ratio (LR), or scaled or quantized versions of these. In particular embodiments, the soft information may be saturated to a maximum value. In a particular embodiment, the message may be a function of the VN soft information and an old CN to VN message from the CN of the second layer to the VN of the second layer. In another embodiment, the message may be the difference between the VN soft information and an old CN to VN message from the CN of the second layer to the VN of the second layer.

At step 104, a new CN to VN message is calculated from the CN of the second layer of the PCM. According to certain embodiments, the new CN to VN message is calculated based on the VN to CN messages from all VNs that are connected to this particular CN.

At step 106, new VN soft information for the VN is calculated. According to certain embodiments, the new VN soft information is calculated based on the VN soft information and a new CN to VN message from a CN of the first layer to the VN and an old CN to VN message from the CN of the first layer to the VN such that the updating of new VN soft information is delayed by at least one layer.

In various particular embodiments, while the new soft information for the VN of the second layer is being calculated, a memory may be simultaneously accessed and information may be read from or written to the memory. For example, in a particular embodiment, soft information and/ or a LLR value of a VN connected to or associated with a CN may be read from the memory. As another example, a message from the CN in the first layer may be read from the memory. As still another example, soft information and/or a LLR value of the VN in the first layer may be written to the memory. Alternatively or additionally, soft information and/ or a LLR value from the CN connected to the VN in the first layer may be written to the memory.

According to certain embodiments, layer permutation may be enabled. More specifically, in order to improve the performance of the fast layered decoding, the correlation of successive layers may be reduced by permuting them in an optimized manner. This will have an effect in steps (8)-(16), as the LLRs $L(q_j)$ are updated in a delayed fashion. In a particular embodiment, the following two-step method may be used for layer permutation:

1. Given the base graph of an LDPC code, the correlation between all pairs of layers is first calculated.

Figure 2:
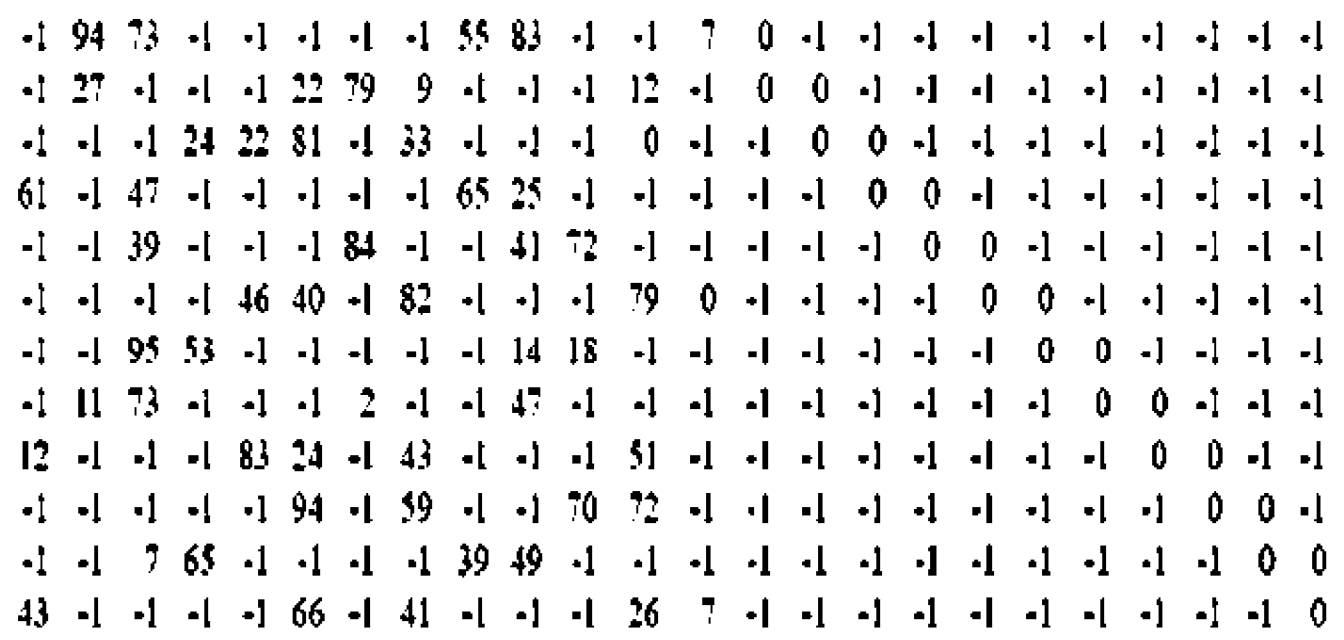

The correlation is defined as the inner product of blocks in layers, where each block will map to 0 if its value is −1 (remember that the −1 notation corresponds to a zero sub block of size Z×Z) and to 1, otherwise. The correlations are stored in the matrix denoted by C. As an example, consider the base graph of FIG. 2, described above. The correlation between layers 1 and 2 is C(1,2)=2, while correlation between layers 1 and 3 is C(1,3)=0.

2. Given layer $1 \leq i \leq M/Z$, we reorder layer i+1 with layer j if $$C(i, j) = \min_{i+1 \leq i' \leq M/Z} C(i, i').$$

Returning to FIG. 2, for example, we can permute layer 2 and 3 as it turns out that the correlation between layer 1 and the new layer 2 (previous layer 3) becomes zero.

Figure 6:
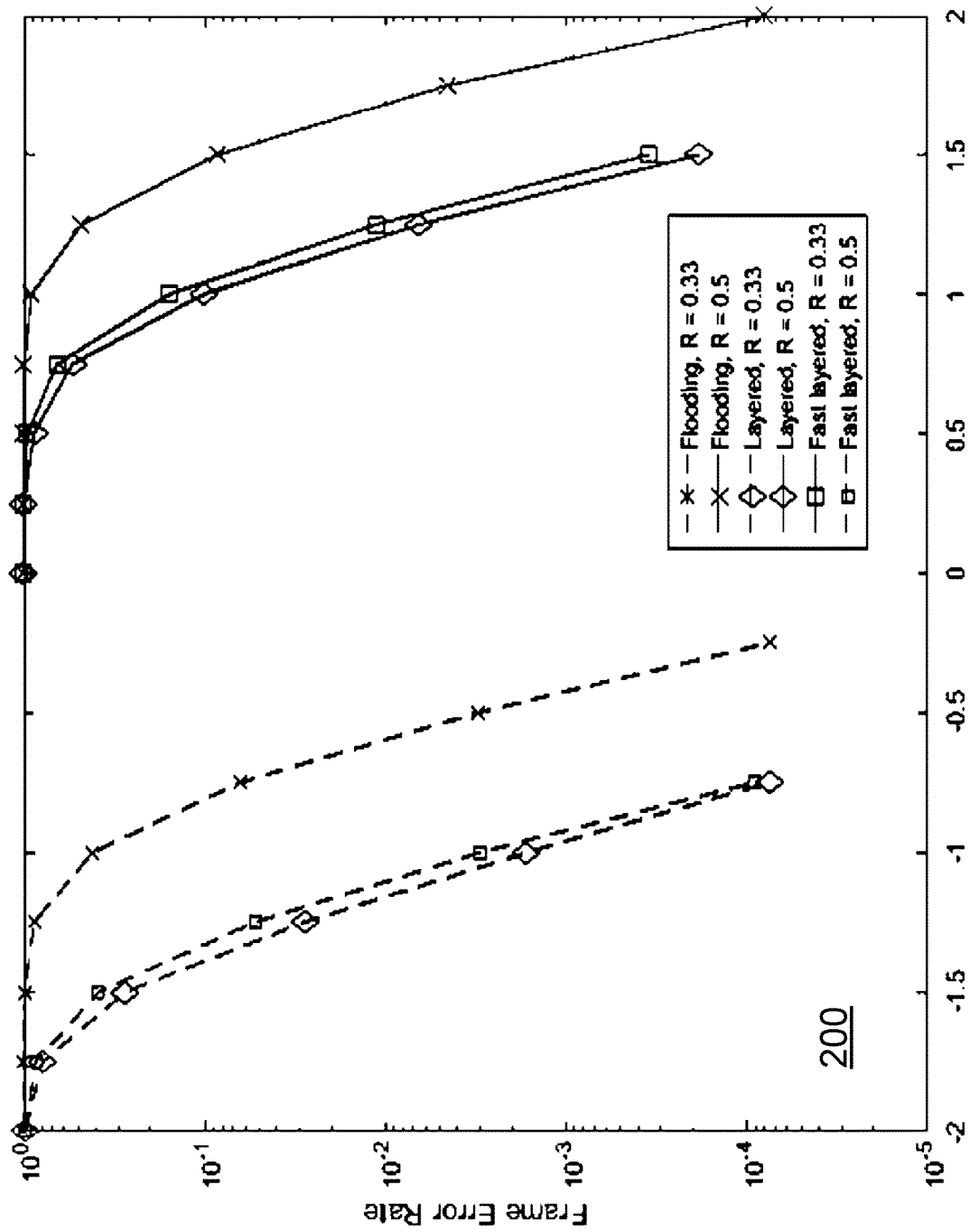
FIG. 6 illustrates a comparison of different decoding algorithms, including the fast layered decoding algorithm, according to certain embodiments.

FIG. 6 illustrates a graph 200 showing a comparison of different decoding algorithms, including fast layered decoding, according to certain embodiments. More specifically, different algorithms are compared, including flooding, layered and fast layered in terms of frame error rate vs. energy per symbol (E_s/N_0). An information block length k=2048, for rates R=½ and R=⅓, QPSK modulation and the sum-product algorithm with 15 iterations was used. The simulation results demonstrate the efficiency of the fast layered decoding for an LDPC code proposed for NR which is summarized in R1-1611321, "Design of LDPC Codes for NR", Ericsson, November 2016.

It may be observed that at a FER of 0.1 the gap between the layered (benchmark method) and fast layered (without layer permutation) is only 0.05 dB, while the fast layered requires in the best case only half of the layered decoding latency. It should be noted that the performance difference between layered and fast layered depends on the structure of the PCM. If the PCM is very dense, the impact of the approximations done for non-orthogonal rows with fast layered may be higher. On the other hand, if the PCM is very sparse, the impact may be low.

Figure 7:
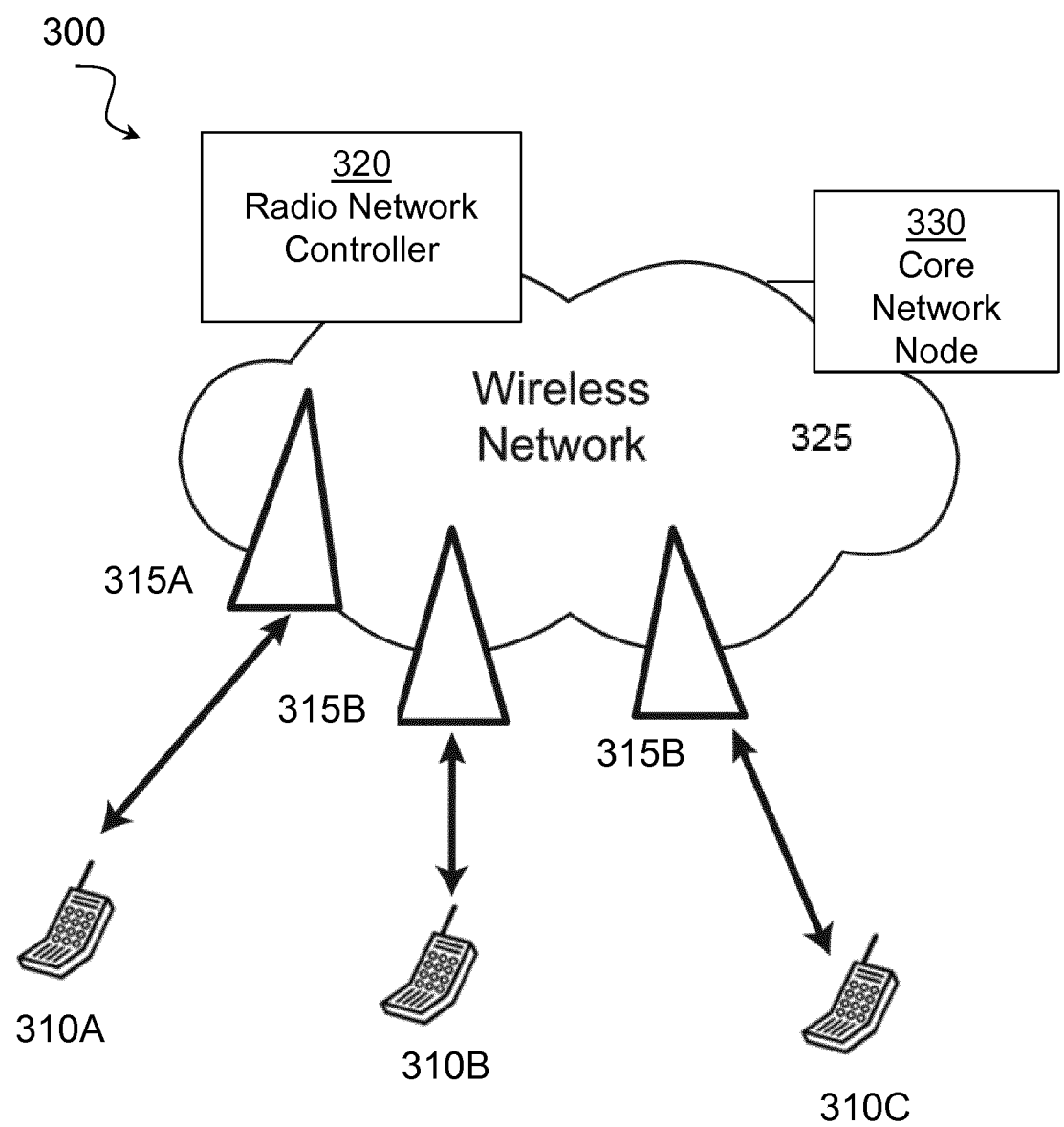
FIG. 7 illustrates an example network for fast layered decoding for LDPC codes, according to certain embodiments.

FIG. 7 is a block diagram illustrating an embodiment of a network 300 for fast layered decoding for LDPC codes of a PCM, in accordance with certain embodiments. Network 300 includes one or more wireless devices 310A-C, which may be interchangeably referred to as wireless devices 310 or UEs 310, and network nodes 315A-C, which may be interchangeably referred to as network nodes 315 or eNo-deBs 315, radio network controller 320, and a core network node 330. A wireless device 310 may communicate with network nodes 315 over a wireless interface. For example, wireless device 310A may transmit wireless signals to one or more of network nodes 315, and/or receive wireless signals from one or more of network nodes 315. The wireless signals may contain voice traffic, data traffic, control signals, and/or any other suitable information. In some embodiments, an area of wireless signal coverage associated with a network node 315 may be referred to as a cell. In some embodiments, wireless devices 310 may have D2D capability. Thus, wireless devices 310 may be able to receive signals from and/or transmit signals directly to another wireless device 310. For example, wireless device 310A may be able to receive signals from and/or transmit signals to wireless device 310B.

In certain embodiments, network nodes 315 may interface with a radio network controller 320. Radio network controller 320 may control network nodes 315 and may provide certain radio resource management functions, mobility management functions, and/or other suitable functions. In certain embodiments, radio network controller 320 may interface with core network node 330 via an interconnecting network 325. The interconnecting network 325 may refer to any interconnecting system capable of transmitting audio, video, signals, data, messages, or any combination of the preceding. The interconnecting network may include all or a portion of a public switched telephone network (PSTN), a public or private data network, a local area network (LAN), a metropolitan area network (MAN), a wide area network (WAN), a local, regional, or global communication or computer network such as the Internet, a wireline or wireless network, an enterprise intranet, or any other suitable communication link, including combinations thereof.

Core network node 330 may manage the establishment of communication sessions and provide various other functionality for wireless communication device 310. Wireless communication device 310 exchanges certain signals with core network node 330 using the non-access stratum layer. In non-access stratum (NAS) signaling, signals between wireless communication device 310 and core network node 330 pass transparently through network nodes 320.

As described above, example embodiments of network 300 may include one or more wireless devices 310, and one or more different types of network nodes capable of communicating (directly or indirectly) with wireless devices 310. Wireless device 310 may refer to any type of wireless device communicating with a node and/or with another wireless device in a cellular or mobile communication system. Examples of wireless device 310 include a mobile phone, a smart phone, a PDA (Personal Digital Assistant), a portable computer (e.g., laptop, tablet), a sensor, a modem, a machine-type-communication (MTC) device/machine-to-machine (M2M) device, laptop embedded equipment (LEE), laptop mounted equipment (LME), USB dongles, a D2D capable device, or another device that can provide wireless communication. A wireless device 110 may also be referred to as UE, a station (STA), a device, or a terminal in some embodiments. Also, in some embodiments, generic terminology, "radio network node" (or simply "network node") is used. It can be any kind of network node, which may comprise a Node B, base station (BS), multi-standard radio (MSR) radio node such as MSR BS, eNode B, network controller, radio network controller (RNC), base station controller (BSC), relay donor node controlling relay, base transceiver station (BTS), access point (AP), transmission points, transmission nodes, RRU, RRH, nodes in distributed antenna system (DAS), core network node (e.g. MSC, MME etc.), O&M, OSS, SON, positioning node (e.g. E-SMLC), MDT, or any suitable network node. Each of wireless communication device 310, network node 315, radio network controller 320, and core network node 330 include any suitable combination of hardware and/or software. Example embodiments of network nodes 315, wireless devices 310, and other network nodes (such as radio network controller or core network node) are described in more detail with respect to FIGS. 8, 9, and 11, respectively.

Although FIG. 7 illustrates a particular arrangement of network 300, the present disclosure contemplates that the various embodiments described herein may be applied to a variety of networks having any suitable configuration. For example, network 300 may include any suitable number of wireless devices 310 and network nodes 315, as well as any additional elements suitable to support communication between wireless devices or between a wireless device and another communication device (such as a landline telephone). In certain embodiments, wireless communication device 310, network node 320, and core network node 330 use any suitable radio access technology, such as long term evolution (LTE), LTE-Advanced, UMTS, HSPA, GSM, cdma2000, WiMax, WiFi, another suitable radio access technology, or any suitable combination of one or more radio access technologies. For purposes of example, various embodiments may be described within the context of certain radio access technologies. However, the scope of the disclosure is not limited to the examples and other embodiments could use different radio access technologies.

Figure 8:
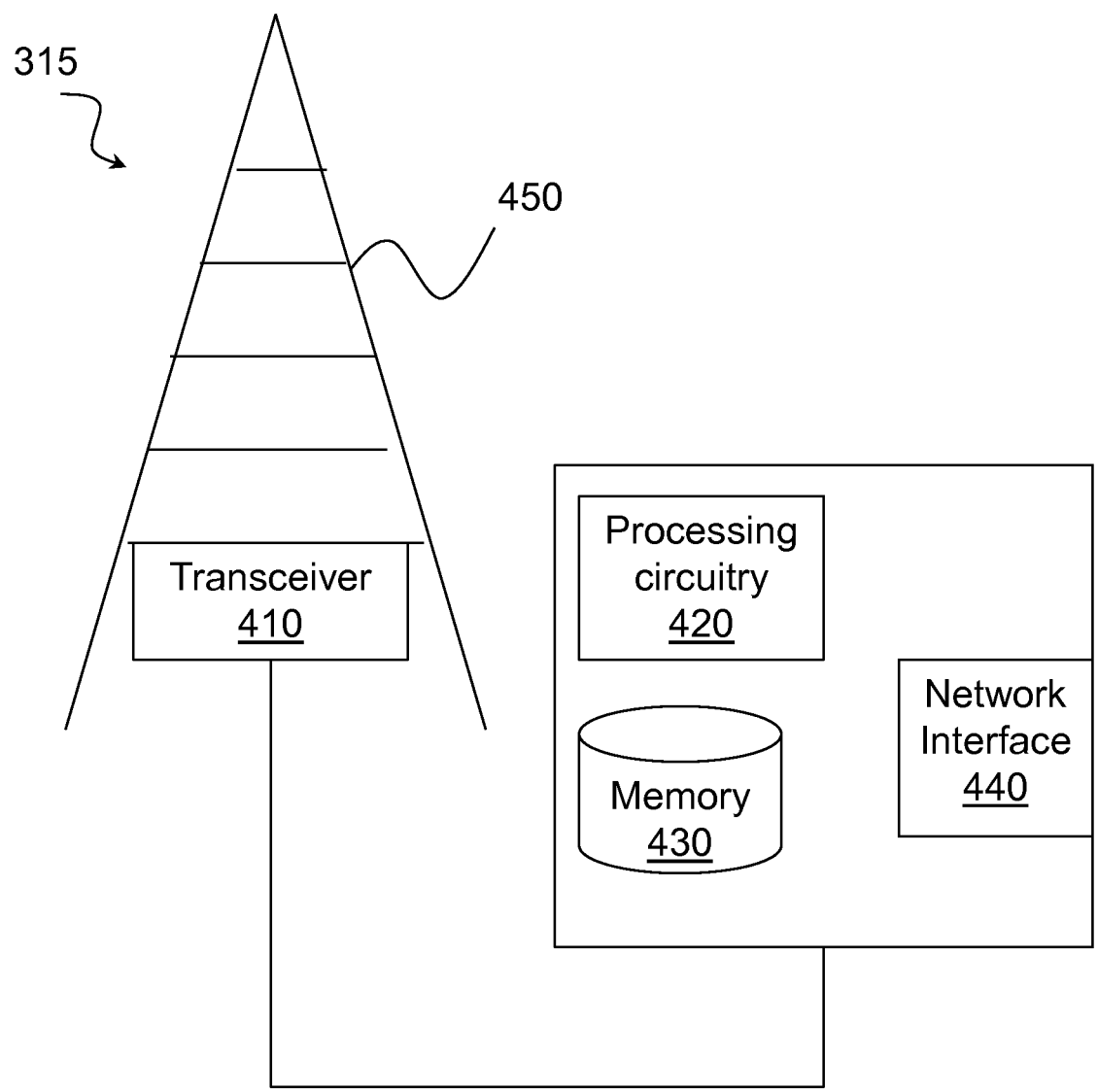
FIG. 8 illustrate an example network node for fast layered decoding for LDPC codes, according to certain embodiments.

FIG. 8 illustrate an example network node 315 for fast layered decoding for LDPC codes, according to certain embodiments. As described above, network node 315 may be any type of radio network node or any network node that communicates with a wireless device and/or with another network node. Examples of a network node 315 are provided above.

Network nodes 315 may be deployed throughout network 300 as a homogenous deployment, heterogeneous deployment, or mixed deployment. A homogeneous deployment may generally describe a deployment made up of the same (or similar) type of network nodes 315 and/or similar coverage and cell sizes and inter-site distances. A heterogeneous deployment may generally describe deployments using a variety of types of network nodes 315 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 315 may include one or more of transceiver 410, processing circuitry 420, memory 430, and network interface 440. In some embodiments, transceiver 410 facilitates transmitting wireless signals to and receiving wireless signals from wireless device 410 (e.g., via an antenna 450), processing circuitry 420 executes instructions to provide some or all of the functionality described above as being provided by a network node 315, memory 430 stores the instructions executed by processing circuitry 420, and network interface 440 communicates signals to backend network components, such as a gateway, switch, router, Internet, Public Switched Telephone Network (PSTN), core network nodes or radio network controllers, etc.

In certain embodiments, network node 315 may be capable of using multi-antenna techniques, and may be equipped with multiple antennas and capable of supporting MIMO techniques. The one or more antennas may have controllable polarization. In other words, each element may have two co-located sub elements with different polarizations (e.g., 90 degree separation as in cross-polarization), so that different sets of beamforming weights will give the emitted wave different polarization.

Processing circuitry 420 may include any suitable combination of hardware and software implemented in one or more modules to execute instructions and manipulate data to perform some or all of the described functions of network node 315. According to certain embodiments, wherein network node 315 comprises a receiver for fast layered decoding for LDPC codes with a PCM that includes at least a first layer and a second layer, processing circuitry 420 may be operable to execute instructions to cause the network node to: read, from memory 430, VN soft information associated with a message from a VN to a CN of the second layer of the PCM; calculate a new CN to VN message from the CN of the second layer of the PCM; and calculate new VN soft information for the VN associated with the CN of the second layer, wherein the new VN soft information is calculated based on the VN soft information and a new CN to VN message from a CN of the first layer and an old CN to VN message from the CN of the first layer such that the updating of new VN soft information is delayed by at least one layer. In some embodiments, processing circuitry 420 may include, for example, one or more computers, one or more processors, one or more central processing units (CPUs), one or more microprocessors, one or more applications, and/or other logic.

Memory 430 is generally operable to store instructions, such as a computer program, software, an application including one or more of logic, rules, algorithms, code, tables, etc. and/or other instructions capable of being executed by a processor. Examples of memory 430 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 440 is communicatively coupled to processing circuitry 420 and may refer to any suitable device operable to receive input for network node 315, send output from network node 315, perform suitable processing of the input or output or both, communicate to other devices, or any combination of the preceding. Network interface 440 may include appropriate hardware (e.g., port, modem, network interface card, etc.) and software, including protocol conversion and data processing capabilities, to communicate through a network.

Other embodiments of network node 315 may include additional components beyond those shown in FIG. 8 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components. Additionally, the terms first and second are provided for example purposes only and may be interchanged.

Figure 9:
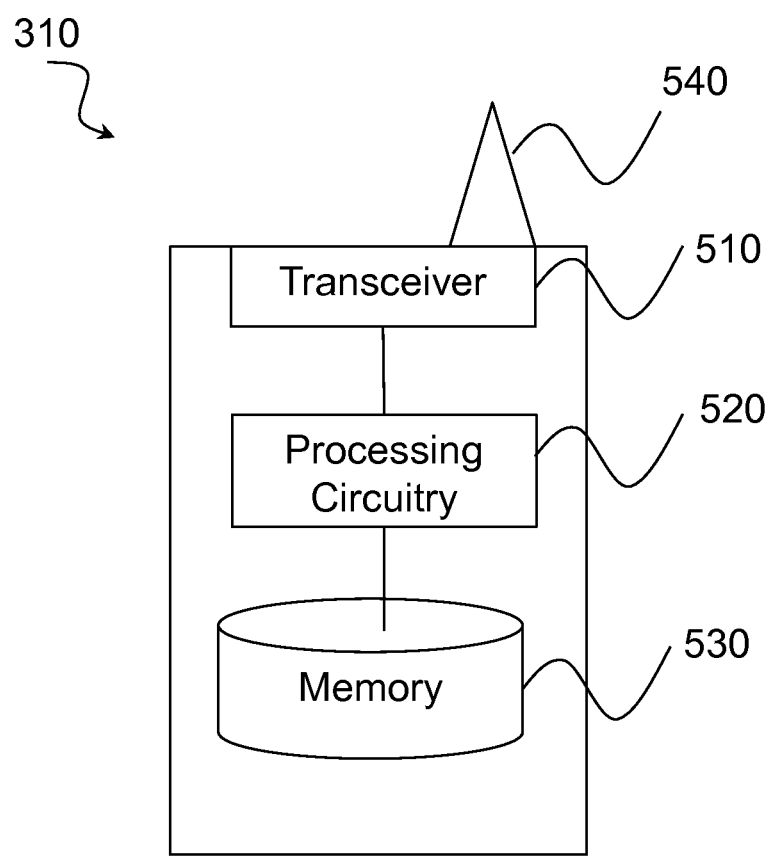
FIG. 9 illustrates an example wireless device for fast layered decoding for LDPC codes, according to certain embodiments.

FIG. 9 illustrates an example wireless device 310 for fast layered decoding for LDPC codes, in accordance with certain embodiments. As depicted, wireless device 310 includes transceiver 510, processing circuitry 520, and memory 530. In some embodiments, transceiver 510 facilitates transmitting wireless signals to and receiving wireless signals from network node 315 (e.g., via an antenna 540), processing circuitry 520 executes instructions to provide some or all of the functionality described above as being provided by wireless device 310, and memory 530 stores the instructions executed by processing circuitry 520. Examples of a wireless device 310 are provided above.

Processing circuitry 520 may include any suitable combination of hardware and software implemented in one or more modules to execute instructions and manipulate data to perform some or all of the described functions of wireless device 310. According to certain embodiments, wherein wireless device 310 comprises a receiver for fast layered decoding for LDPC codes with a PCM that includes at least a first layer and a second layer, processing circuitry 420 may be operable to execute instructions to cause wireless device 310 to: read, from memory 430, VN soft information associated with a message from a VN to a CN of the second layer of the PCM; calculate a new CN to VN message from the CN of the second layer of the PCM; and calculate new VN soft information for the VN associated with the CN of the second layer, wherein the new VN soft information is calculated based on the VN soft information and a new CN to VN message from a CN of the first layer and an old CN to VN message from the CN of the first layer such that the updating of new VN soft information is delayed by at least one layer. In some embodiments, processing circuitry 520 may include, for example, one or more computers, one or more processors, one or more central processing units (CPUs), one or more microprocessors, one or more applications, and/or other logic.

Memory 530 is generally operable to store instructions, such as a computer program, software, an application including one or more of logic, rules, algorithms, code, tables, etc. and/or other instructions capable of being executed by a processor. Examples of memory 530 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

Other embodiments of wireless device 310 may include additional components beyond those shown in FIG. 9 that may be responsible for providing certain aspects of the wireless device's functionality, including any of the functionality described above and/or any additional functionality (including any functionality necessary to support the solution described above).

Figure 10:
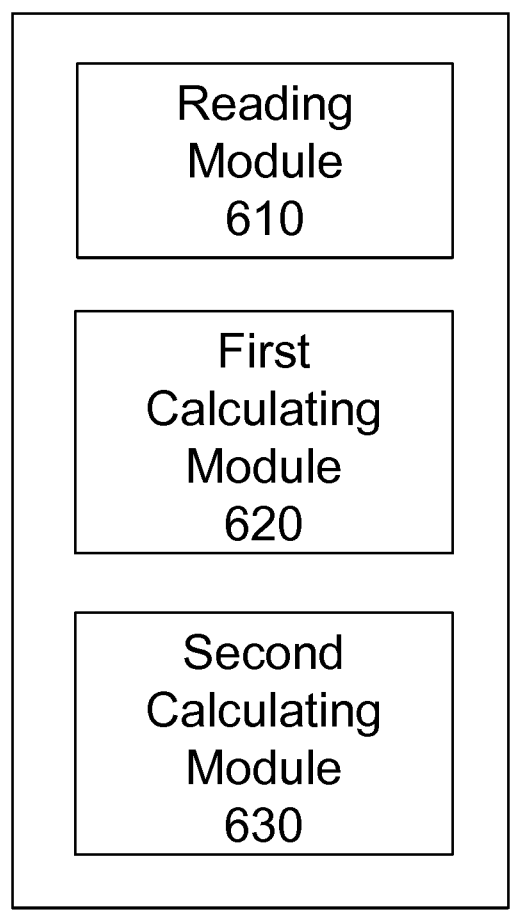
FIG. 10 illustrates an exemplary computer networking virtual apparatus for fast layered decoding for LDPC codes, in accordance with certain embodiments.

In certain embodiments, the method for fast layered decoding for LDPC codes as described above may be performed by virtual computing device. FIG. 10 illustrates an example virtual computing device 600 operating as a receiver for fast layered decoding for LDPC codes, according to certain embodiments. In certain embodiments, virtual computing device 600 may include modules for performing steps similar to those described above with regard to the method illustrated and described in FIG. 5. For example, virtual computing device 600 may include at least one reading module 610, a first calculating module 620, a second calculating module 630, and any other suitable modules for fast layered decoding for LDPC codes. In some embodiments, one or more of the modules may be implemented using any of the processing circuitry 420 or processing circuitry 520 described above with respect to FIGS. 8 and 9, respectively. In certain embodiments, the functions of two or more of the various modules may be combined into a single module.

The reading module 610 may perform the reading functions of virtual computing device 600. For example, in a particular embodiment, reading module 610 may 102 read, from a memory, Variable node (VN) soft information. According to certain embodiments, the VN soft information may be associated with a message from a Variable Node (VN) to a Check Node (CN) of the second layer of the PCM. In various embodiments, the VN soft information may include, for example, a log-likelihood ratio (LLR) value, a likelihood ratio (LR), or scaled or quantized versions of these. In particular embodiments, the soft information may be saturated to a maximum value.

The first calculating module 620 may perform certain calculating functions of virtual computing device 600. For example, in a particular embodiment, first calculating module 620 may calculate a new CN to VN message from the CN of the second layer of the PCM. According to certain embodiments, the new CN may be calculated based on the VN to CN messages from all VNs that are connected to this particular CN.

The second calculating module 620 may perform certain other calculating functions of virtual computing device. For example, in a particular embodiment, second calculating module 630 may calculate new VN soft information for the VN associated with the CN of the second layer. According to certain embodiments, the new VN soft information may be calculated based on the VN soft information and a new CN to VN message from an CN of the first layer and an old CN to VN message from the CN of the first layer such that the updating of new VN soft information is delayed by at least one layer.

Other embodiments of virtual computing device 600 may include additional components beyond those shown in FIG. 10 that may be responsible for providing certain aspects of the above-described functionality and/or any additional functionality (including any functionality necessary to support the solutions described above).

Figure 11:
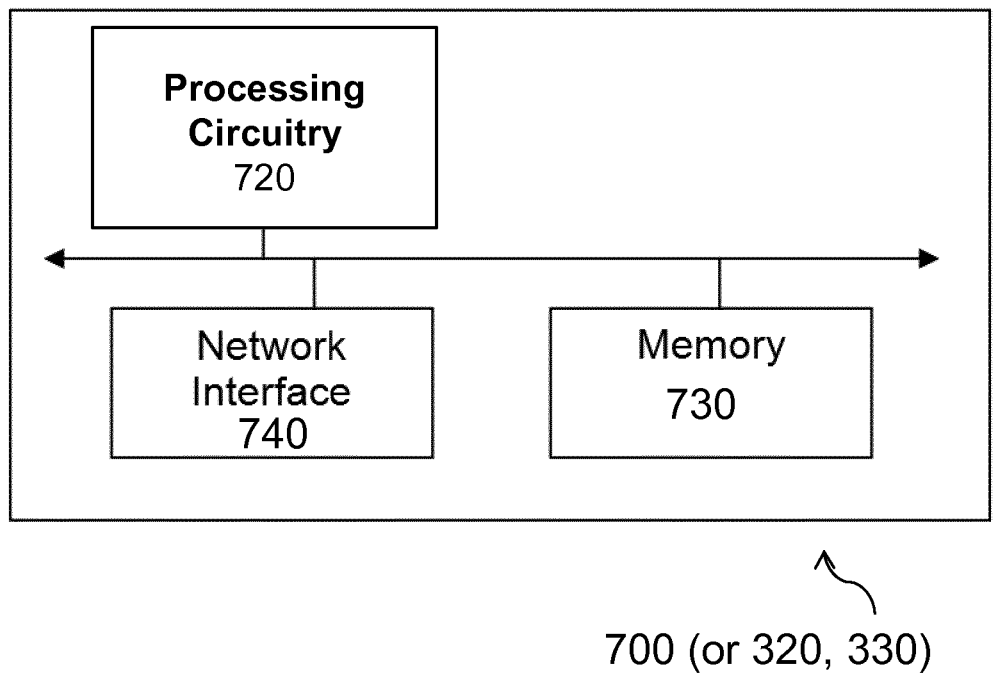
FIG. 11 illustrates an exemplary radio network controller or core network node, according to certain embodiments.

FIG. 11 illustrates an exemplary radio network controller or core network node, in accordance with certain embodiments. Examples of network nodes can include a mobile switching center (MSC), a serving GPRS support node (SGSN), a mobility management entity (MME), a radio network controller (RNC), a base station controller (BSC), and so on. The radio network controller or core network node 700 includes processing circuitry 720, memory 730, and network interface 740. In some embodiments, processing circuitry 720 executes instructions to provide some or all of the functionality described above as being provided by the network node, memory 730 stores the instructions executed by processing circuitry 720, and network interface 740 communicates signals to any suitable node, such as a gateway, switch, router, Internet, Public Switched Telephone Network (PSTN), network nodes 315, radio network controllers or core network nodes 700, etc.

Processing circuitry 720 may include any suitable combination of hardware and software implemented in one or more modules to execute instructions and manipulate data to perform some or all of the described functions of the radio network controller or core network node 700. In some embodiments, processing circuitry 720 may include, for example, one or more computers, one or more processors, one or more central processing units (CPUs), one or more microprocessors, one or more applications, and/or other logic.

Memory 730 is generally operable to store instructions, such as a computer program, software, an application including one or more of logic, rules, algorithms, code, tables, etc. and/or other instructions capable of being executed by a processor. Examples of memory 730 include computer memory (for example, Random Access Memory (RAM) or Read Only Memory (ROM)), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information.

In some embodiments, network interface 740 is communicatively coupled to processing circuitry 720 and may refer to any suitable device operable to receive input for the network node, send output from the network node, perform suitable processing of the input or output or both, communicate to other devices, or any combination of the preceding. Network interface 740 may include appropriate hardware (e.g., port, modem, network interface card, etc.) and software, including protocol conversion and data processing capabilities, to communicate through a network.

Other embodiments of the network node may include additional components beyond those shown in FIG. 11 that may be responsible for providing certain aspects of the network node's functionality, including any of the functionality described above and/or any additional functionality (including any functionality necessary to support the solution described above).

According to certain embodiments, a method for fast layered decoding for LDPC codes of a Parity-Check Matrix (PCM) comprising at least a first layer and a second layer, the method may include:

reading, from a memory, Variable node (VN) soft information, wherein the VN soft information is associated with a message from a Variable Node (VN) to a Check Node (CN) of the second layer of the PCM;

calculating a new CN to VN message from the CN of the second layer of the PCM;

calculating new VN soft information for the VN associated with the CN of the second layer, wherein the new VN soft information is calculated based on the VN soft information and a new CN to VN message from an CN of the first layer and an old CN to VN message from the CN of the first layer such that the updating of new VN soft information is delayed by at least one layer;

optionally, the method further includes switching from delayed updating to real-time updating of VN soft information;

optionally, the method further includes:

optionally, the VN soft information comprises a log-likelihood ratio (LLR) value;

optionally, while processing circuitry is calculating soft information and/or a LLR value for the VN associated with the CN of the second layer, the method further includes simultaneously accessing a memory and performing at least one of:

reading soft information and/or a LLR value of a VN connected to a CN from the memory;

reading a message from the CN in the first layer from the memory;

writing soft information and/or a LLR value of the VN in the first layer to the memory;

writing soft information and/or a LLR value from the CN connected to the VN in the first layer;

optionally, the soft information and/or the LLR value for the VN associated with the CN in the first layer may be based on an old message from the CN associated with the VN and a new message from the CN associated with the VN;

optionally, the new CN to VN message is calculated as a function of a set of values associated with a plurality of messages from a plurality of VNs to the CN of the second layer of the PCM;

optionally, the correlation between all pairs of layers is determined;

optionally, the correlation may be defined as the inner product of blocks in layers, where each block will map to 0 if its value is −1 and to 1, otherwise;

optionally, determining the estimated soft information and/or LLR value includes adjusting the soft information and/or LLR value to partially account for deviations from the layered decoding due to non-orthogonal rows.

According to certain embodiments, a system for fast layered decoding for LDPC codes in a parity check matrix (PCM) may include:

a memory storing instructions; and processing circuitry operable to execute the instructions to cause the processing circuitry to:

read, from the memory, Variable node (VN) soft information, wherein the VN soft information is associated with a message from a Variable Node (VN) to a Check Node (CN) of the second layer of the PCM;

calculate a new CN to VN message from the CN of the second layer of the PCM;

calculate new VN soft information for the VN associated with the CN of the second layer, wherein the new VN soft information is calculated based on the VN soft information and a new CN to VN message from an CN of the first layer and an old CN to VN message from the CN of the first layer such that the updating of new VN soft information is delayed by at least one layer;

optionally, the processing circuitry is further operable to execute the instructions to cause the processing circuitry to switch from delayed updating to real-time updating of VN soft information;

optionally, the VN soft information comprises a log-likelihood ratio (LLR) value;

optionally, while the processing circuitry is calculating soft information and/or a LLR value for the VN associated with the CN of the second layer, the memory is simultaneously accessed and at least one of the following operations is performed:

reading soft information and/or a LLR value of a VN connected to a CN from the memory;

reading a message from the CN in the first layer from the memory;

writing soft information and/or a LLR value of the VN in the first layer to the memory;

writing soft information and/or a LLR value from the CN connected to the VN in the first layer;

optionally, the soft information and/or the LLR value for the VN associated with the CN in the first layer may be based on an old message from the CN associated with the VN and a new message from the CN associated with the VN;

optionally, the new CN to VN message is calculated as a function of a set of values associated with a plurality of messages from a plurality of VNs to the CN of the second layer of the PCM;

optionally, the correlation between all pairs of layers is determined;

optionally, the correlation may be defined as the inner product of blocks in layers, where each block will map to 0 if its value is −1 and to 1, otherwise;

optionally, determining the estimated soft information and/or LLR value includes adjusting the soft information and/or LLR value to partially account for deviations from the layered decoding due to non-orthogonal rows.

Certain embodiments of the present disclosure may provide one or more technical advantages. For example, certain embodiments may provide a sub-optimal decoding method, called fast layered decoding, which has lower decoding latency and utilizes the decoding hardware more efficiently than previous layered decoding techniques. This may be done by keeping the memory access and processing hardware units active simultaneously to avoid excess decoding latency. More specifically, certain embodiments may carry out memory access and computation process simultaneously, without any effort to make the row layers mutually orthogonal to each other. Another technical advantage may be that the proposed decoding algorithm adjusts the LLRs to partially account for deviations from the layered decoding due to non-orthogonal rows. Since the fast layered decoding algorithm works with estimates of the LLRs calculated in layered decoding, the performance in terms of achieved block-error rate may be slightly worse.

Still another technical advantage may be that by applying the fast layered decoding, the decoding is carried out faster, hence, the decoding latency will be reduced by almost half. In certain embodiments, the decoding hardware may also be utilized more efficiently, which may increase the area efficiency of the decoder with up to a factor of two.

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

Abbreviations used in the preceding description include:

ABBREVIATION EXPLANATION

LDPC Low Density Parity Check
LLR Log Likelihood Ratio
LR Likelihood Ratio
VN Variable Node
CN Check Node
PCM Parity Check Matrix

The invention claimed is:

1. A method for fast layered decoding for Low-density Parity-Check (LDPC) codes with a Parity-Check Matrix (PCM) comprising at least a first layer and a second layer, the method comprising:
 reading, from a memory, Variable Node (VN) soft information, wherein the VN soft information is associated with a message from a VN to a Check Node (CN) of the second layer of the PCM;
 calculating a new CN to VN message from the CN of the second layer of the PCM; and
 calculating new VN soft information for the VN, wherein the new VN soft information is calculated based on the VN soft information and a new CN to VN message from a CN of the first layer to the VN and an old CN to VN message from the CN of the first layer to the VN such that the updating of the new VN soft information is delayed by at least one layer, and wherein calculating the new VN soft information comprises adjusting the VN soft information to partially account for deviations from the layered decoding due to non-orthogonal rows;
 determining a correlation between all pairs of layers; and
 based on the correlation, reordering at least two of the layers.

2. The method of claim 1, further comprising switching from delayed updating to real-time updating of the VN soft information.

3. The method of claim 1, wherein at least one of the VN soft information and the new VN soft information comprises a log-likelihood ratio (LLR) value.

4. The method of claim 1, wherein while processing circuitry is calculating the new soft information for the VN, the method further includes simultaneously accessing the memory and performing at least one of:
 reading soft information of a VN associated with the CN from the memory;
 reading a message from the CN in the first layer from the memory;
 writing soft information of the VN in the first layer to the memory; and
 writing soft information associated with a message from the CN in the first layer to the VN.

5. The method of claim 1, wherein at least one of the soft information for the VN associated with the CN in the first layer may be based on an old message from the CN associated with the VN and a new message from the CN associated with the VN.

6. The method of claim 1, wherein the method is performed by a wireless device.

7. The method of claim 1, wherein the method is performed by a network node.

8. A system for fast layered decoding for Low-Density Parity-Check (LDPC) codes defined with a parity check matrix (PCM) comprising a first layer and a second layer, the system comprising:
 a memory storing instructions; and
 processing circuitry operable to execute the instructions to cause the processing circuitry to:
  obtain Variable node (VN) soft information associated with a message from a VN to a Check Node (CN) of the second layer of the PCM; and
  calculate a new CN to VN message from the CN of the second layer of the PCM; and
  calculate new VN soft information for the VN, wherein the new VN soft information is calculated based on the VN soft information and a new CN to VN message from a CN of the first layer to the VN and an old CN to VN message from the CN of the first layer to the VN such that the updating of the new VN soft information is delayed by at least one layer, and wherein calculating the new VN soft information comprises adjusting the VN soft information to partially account for deviations from the layered decoding due to non-orthogonal rows;
  determine a correlation between all pairs of layers; and
  based on the correlation, reorder at least two of the layers.

9. The system of claim 8, wherein the processing circuitry is further operable to execute the instructions to cause the processing circuitry to switch from delayed updating to real-time updating of the VN soft information.

10. The system of claim 8, wherein at least one of the VN soft information and the new VN soft information comprises a log-likelihood ratio (LLR) value.

11. The system of claim 10, wherein the message from the VN to the CN of the second layer is the difference between the VN soft information and an old CN to VN message from the CN of the second layer to the VN.

12. The system of claim 8, wherein while the processing circuitry is calculating the new soft information for the VN, the memory is simultaneously accessed and at least one of the following operations is performed:
 reading soft information of a VN associated with a CN from the memory;
 reading a message from the CN in the first layer from the memory;
 writing soft information of the VN to the memory; and
 writing soft information associated with a message from the CN in the first layer to the VN.

13. The system of claim 8, wherein the VN soft information for the VN associated with the CN in the first layer may be based on an old message from the CN associated with the VN and a new message from the CN associated with the VN.

14. The system of claim 8, wherein the new CN to VN message is calculated as a function of a set of values associated with a plurality of messages from a plurality of VNs to the CN of the second layer of the PCM.

15. The system of claim 8, wherein the correlation may be defined as the inner product of blocks in layers, where each block will map to 0 if its value is −1 and to 1, otherwise.

16. The system of claim 8, wherein the message from the VN to the CN of the second layer is a function of the VN soft information and an old CN to VN message from the CN of the second layer to the VN.

17. The system of claim 8, wherein the system comprises a wireless device.

18. The system of claim 8, wherein the system comprises a network node.

* * * * *